United States Patent [19]
Young et al.

[11] Patent Number: 4,903,108
[45] Date of Patent: Feb. 20, 1990

[54] RADIATION HARDENED COMPLEMENTARY TRANSISTOR INTEGRATED CIRCUITS

[75] Inventors: William R. Young; Anthony L. Rivoli, both of Palm Bay; William W. Wiles, Jr., West Melbourne, all of Fla.

[73] Assignee: Harris Corporation

[21] Appl. No.: 209,365

[22] Filed: Jun. 21, 1988

[51] Int. Cl.$^4$ ............................................. H01L 21/76
[52] U.S. Cl. ............................................. 357/49; 357/55; 357/42; 357/50; 437/62; 437/63; 437/70
[58] Field of Search ................. 357/49, 50, 55, 42; 437/67, 62, 63

[56] References Cited

U.S. PATENT DOCUMENTS 4,786,960  11/1988  Jeuch .................................. 357/42

FOREIGN PATENT DOCUMENTS 59-259152  6/1986  Japan .................................. 437/67

OTHER PUBLICATIONS

"Characterization of the Lateral and Vertical Parasitic Transistors in a Trench Isolated CMOS Process", M. C. Roberts et al., pp. 411–412.
"Mosfet Achieved by a Combination of Polysilicon Sidewall and Simox Technology", T. Ohno et al., *Electronic Letters*, pp. 559–560, May 1986.

Primary Examiner—Andrew J. James
Assistant Examiner—David Soltz
Attorney, Agent, or Firm—Barnes & Thornburg

[57] ABSTRACT

Integrated circuits with vertical isolated trenches are radiation hardened by providing vertical gate segments, preferably, of doped polycrystalline silicon, in the trenches and connected at the bottom of the trenches to a region of the same conductivity type. The surface devices may be complementary and the vertical gates may also be complementarily doped. A method of fabrication is described for a single crystal wafer, as well as SOI.

11 Claims, 3 Drawing Sheets

RADIATION HARDENED COMPLEMENTARY TRANSISTOR INTEGRATED CIRCUITS

BACKGROUND AND SUMMARY OF THE INVENTION

The present invention relates generally to integrated circuits with vertical trenches, and more specifically to integrated circuits having vertical trenches and complementary devices.

The investigation of parasitic vertical MOS transistors resulting from trench isolated lateral CMOS processes is described in Abstract No. 274, "Characterization of the Lateral and Vertical Parasitic Transistors in a Trench Isolated CMOS Process", M.C. Roberts et al., pp. 411–412. This articles indicates that the parasitic vertical MOS transistors will either not operate because of the voltages of the circuit or can be minimized by appropriate well doping and side wall oxide thickness.

Parasitic MOSFETs have also been investigated in "MOSFET Achieved by a Combination of Polysilicon Sidewall and SIMOX Technology", T. Ohno et al., Electronic Letters, pp. 559–560, May, 1986. The multi sidewall isolation layers of SiO2, polysilicon and field SiO2 and bottom isolation by by higher oxygen-doped polysilicon and buried oxide act as shield and traps for radiation induced charges.

The problem is further increased for devices which are subjected to irradiation. Vertical trench and vertical trench in combination with silicon on insulator (SOI) integrated circuits, although having some advantages have problems of increase in subthreshold leakage currents, threshold voltage shifts, and transconductance degradation by ionizing radiation. For N channel MOSFETs, it is especially important to eliminate the serious problems of increased leakage current caused by side and back or bottom channel conduction due to radiation induced positive charges trapped in the field-silicon dioxide layer and the buried oxide layer, one solution was discussed previously. Another solution is to fill the vertical trenches with a thin gate oxide and polycrystalline silicon semiconductor material and biasing the polycrystalline to turn the parasitic MOS device off. This may be sufficient in a single device conductivity circuit, but in a complementary circuit, wherein N and P devices are included, biasing the polycrystalline to either the positive or negative supply terminal will tend to turn either the parasitic NMOS off and the parasitic PMOS on or vice versa. Thus, this is not a solution for complementary circuitry.

Thus, an object of the invention is to provide radiation hardened integrated circuits including complementary devices.

Another object of the present invention is to provide a method of fabricating an integrated circuit having radiation hardened complementary devices.

An even further object of the present invention is to provide a circuit method of fabricating an integrated circuit having vertical isolation trenches and complementary devices which are radiation hard.

A still further object of the present invention is to provide a circuit and method of fabricating an integrated circuit having complementary devices on a silicon-on-insulator substrate and lateral dielectrical isolation trenches which is radiation hard.

These and other objects of the invention are attained by providing in the lateral trenches vertical gate segments separated from the lateral edge of the trenches by a dielectric gate layer and being connected at the bottom of the trench to doped device region. In a preferred embodiment the vertical gate segments are semiconductor material having the same doping as the doped device region in the bottom of the trench. The trenches are further filled with dielectric isolation to separate the gate segments from each other.

To reduce the parasitic capacitance, the vertical gate segment is provided only between two heavily doped regions of one conductivity type, separated by a lighter doped region of another second conductivity type, where all three regions terminate at the vertical edge of the trench. Although the planar devices described in the specification are directed to CMOS transistors, the invention is applicable to resistors, capacitors or any other device or devices forms of multiple semiconductor regions.

The method of fabrication includes forming the isolation trenches, covering the lateral walls with a dielectric insulative layer, followed by forming vertical semiconductor gate segments which are connected to the silicon at the bottom of the trench. The trenches are then filled with insulative material and planarized. The isolated islands and their adjacent vertical semiconductor gate segments are then doped with common conductivity type impurities. Surface regions of the opposite conductivity type than the previously formed regions are then formed. The dielectric insulative layer and semiconductor gate segments are applied by forming appropriate layers and then selectively removing, for example by reactive ion etching. The dielectric insulative layer at the bottom of the trenches is removed either totally, or selectively, prior to applying the semiconductor layer.

To form semiconductor gate segments only adjacent portions of the trench, the trench formation initially only forms the semiconductor gate segment portions of the trench with subsequent trench formation after the formation of the insulative layer and semiconductor gate regions. Where the substrate includes a buried insulative layer, the initial trench formation terminates prior to reaching the buried region. The removing of the semiconductor layer to form the vertical semiconductor gate portions continues to further increase the depth of the trench down to the buried insulative layer.

Other objects, advantages and novel features of the present invention will become apparent from the following detailed description of the invention when considered in conjunction with the accompanying drawings.

DETAILED DESCRIPTION OF THE DRAWINGS

Figure 1:
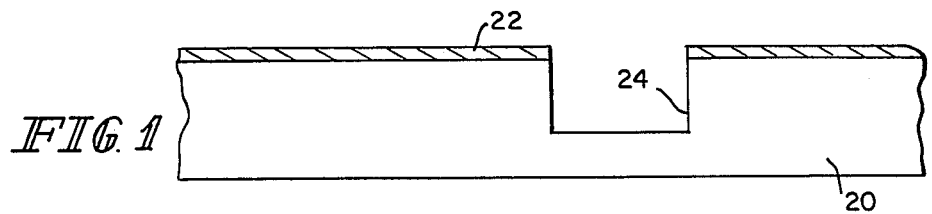
FIGS. 1–10 are cross-sectional views of an integrated circuit at various stages of fabrication according to the principles of the present invention.

The process begins by forming an insulative layer 22 on a substrate 20. The insulative layer 22 is then masked to form an opening defining the trenches. The exposed insulative layer 22 and the underlying portion of the substrate 20 are then removed by, for example reactive ion etching, to form vertical trenches 24 therein. The wafer at this stage of process is illustrated in FIG. 1.

Figure 2:
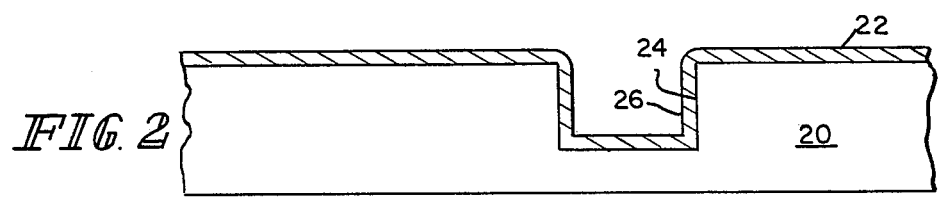
Figure 3:
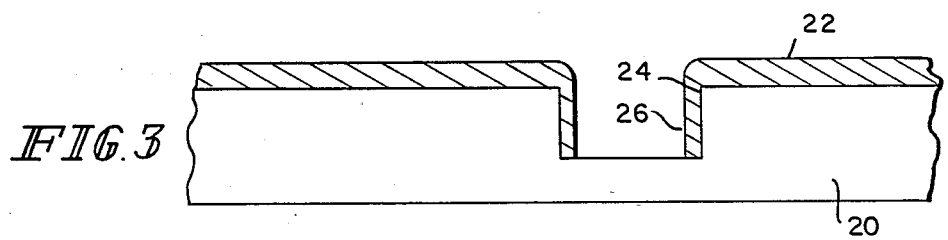

The wafer is then oxidized, forming a layer 26 along the exposed lateral and bottom walls of the trench 24 as illustrated in FIG. 2. The insulative layer 26 is totally removed from the bottom of the trench 24 by, for example, reactive ion etching, as illustrated in FIG. 3.

Figure 4:
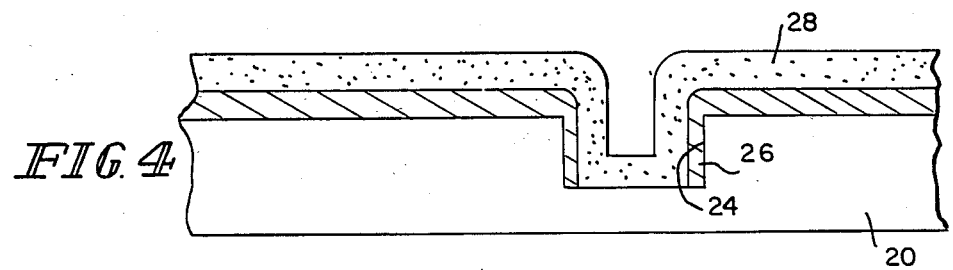
Figure 5:
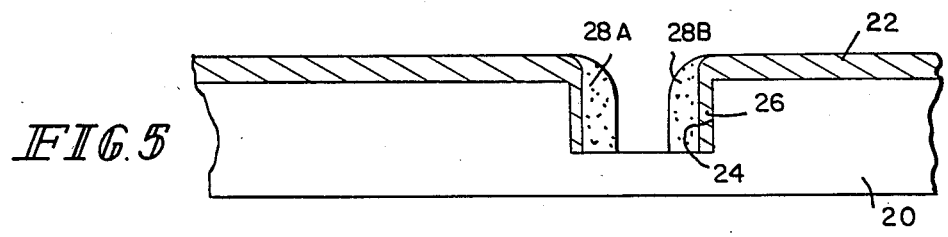

A layer 28 of polycrystalline semiconductor material is then applied to the bottom of the trench 24, the oxide layer 26 covering the walls of the trench 24 and the oxide layer 22 covering the substrate, as illustrated in FIG. 4. The polycrystalline layer 28 is then selectively removed by, for example, reactive ion etching, to leave polycrystalline spacers or gate portions 28A and 28B in the trenches 24 connected at the bottom to the substrate 20, as illustrated in FIG. 5. The layer 28 may be any gate material, for example, single crystal semiconductor, silicides or refractory metal.

Figure 6:
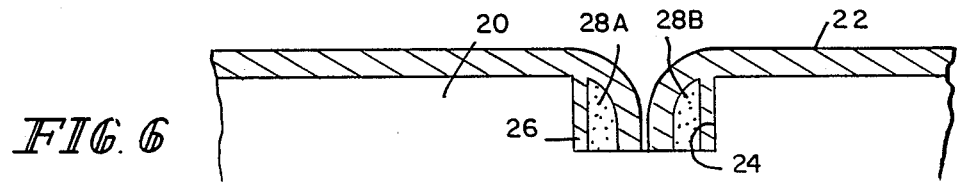
Figure 7:
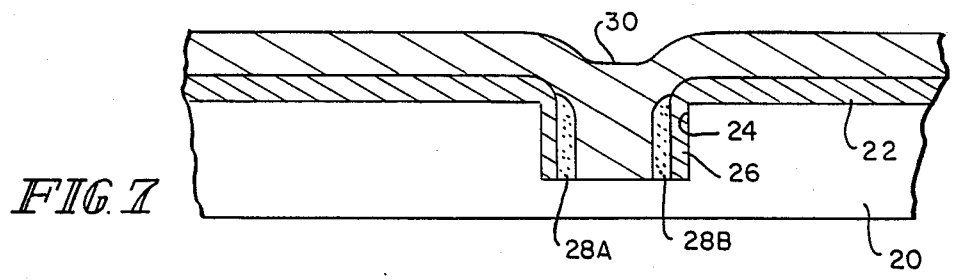

Polycrystalline gate segments 28A and 28B are then oxidized to further cover the exposed surface of the polycrystalline gate segments 28A and 28B, as illustrated in FIG. 6. The trenches are then filled with insulative material 30, as illustrated in FIG. 7, and planarized using well-known methods to produce the planar structure of FIG. 8. The resulting structure forms a plurality of laterally dielectrically isolated islands having adjacent gate segments laterally isolated therefrom by a thin insulative layer 26 yet connected at their bottoms to the substrate 20.

Figure 9:
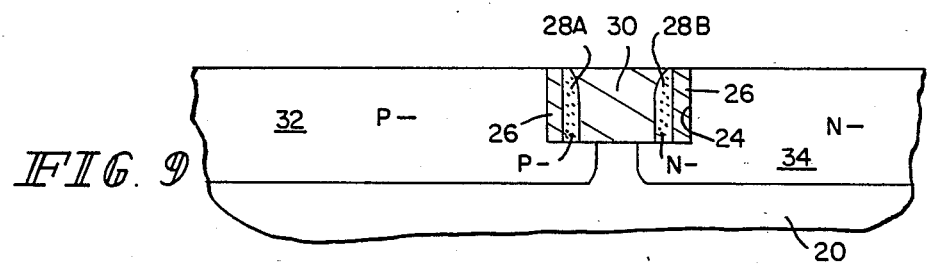
Figure 10:
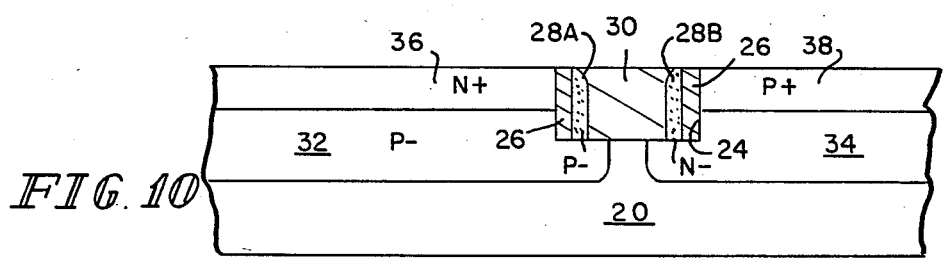
Figure 13:
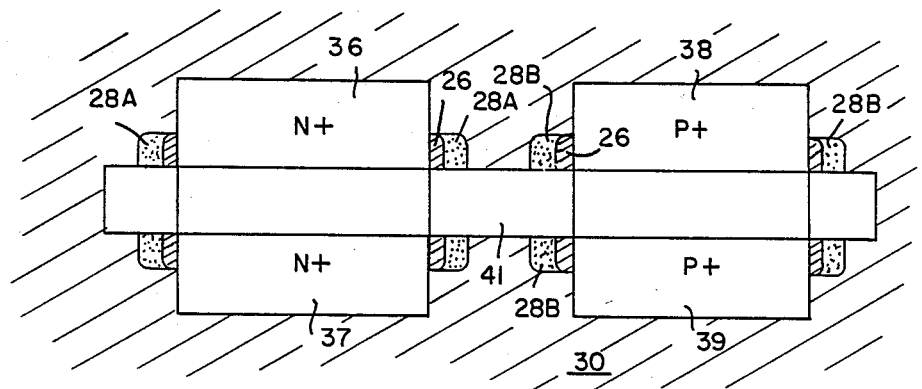
FIG. 13 is a plan view of an integrated circuit showing modified gate segments according to the principles of the present invention.

The wafer is then masked and P type impurities are then selectively introduced to form the P− region 32 and to dope the adjacent polycrystalline gate segment 28A. Next, N type impurities are introduced to form the N− region 34 and N dope adjacent gate segment 28B, as illustrated in FIG. 9. N+ type impurities are introduced into region 32 to form N+ source and drain regions 36, 37 and body contact regions in N− region 34 (not shown). P+ impurities are then introduced to form P+ source and drain regions 38, 39 in the N− region 34 and P+ body contact to P− region 32 (not shown), as illustrated in FIG. 10 and FIG. 13. The order of introducing the P and N impurities may be reversed.

As can be seen, the NMOS gate 28A on the sidewall is P type and is connected to the P body 32 and the PMOS gate 28B on the sidewall is N type and is connected to the N body 34. This polycrystalline doping raises the parasitic device threshold voltage because of the oms term and connecting the gate to the body tends to bias the device off. Using polycrystalline silicon for the gates allows the oms term setting, ohmic contact of the body and isolation of the top of the gate by oxidation during subsequent process formation of the normal top side MOS devices.

Figure 8:
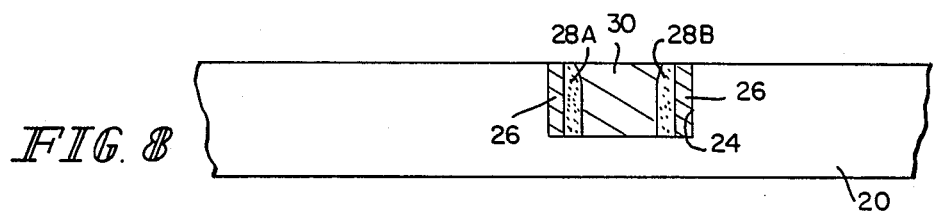
Figure 11:
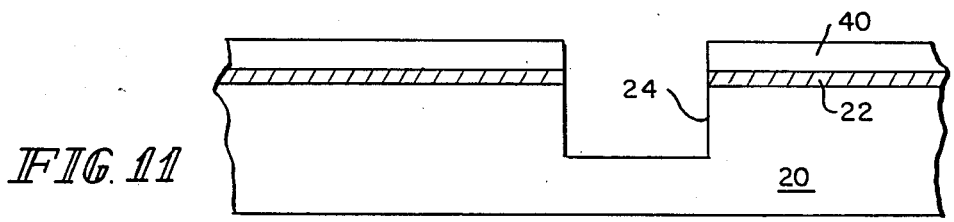
FIG. 11 is a cross-sectional view of a modified step forming a sacrificial layer to be used in planarization.

To aid in the planarization process of FIG. 8, a sacrificial polycrystalline silicon layer 40 may be applied to the first insulative layer 22 on the wafer 20 before forming the trench 24, as illustrated in FIG. 11. The trench 24 is then formed as illustrated in FIG. 1. The polycrystalline sacrificial layer 40 then remains on through the steps illustrated in FIGS. 1–7 and is removed during the planarization process.

Figure 12:
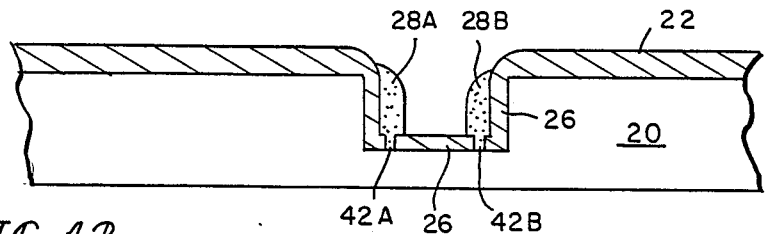
FIG. 12 is a cross-sectional view of a modified step of the method of fabrication illustrating selective removal of the insulative layer in the base of the trench.

As an alternative to the step of FIG. 3, a photoresist material is applied to the wafer of the step of FIG. 2 and patterned to form selective openings 42 in the insulative layer 26 on the bottom of the trench 24. The oxide of the bottom of the trench is then selectively removed to form apertures 42a and 42b exposing the bottom of the trench of the substrate 20. The photoresist material is then removed and the process is continued using the application and removal of the polycrystalline layer 28 of FIGS. 4 and 5. The resulting structure is illustrated in FIG. 12, wherein the gate segments 28A and 28B are connected through apertures 42a and 42b respectively to the substrate 20 at the bottom of the trench 24. By using a photoresist step to selectively remove the insulative layer 26 at the bottom of the trench, an insulative layer 26 is provided under the polycrystalline layer 28 to act as an etch stop during the polycrystalline removal step of FIG. 5. This prevents further etching of the substrate 20 at the exposed base of the trench 24.

If the source/drain parasitic capacitance along the sidewalls between the gate segments 28A and 28B and the source/drain regions 36, 37 and 38, 39 are objectionable, the overlapping of the gate segments 28A and 28B to the source/drain segments 36, 37 and 38, 39 respectively may be reduced. As illustrated in FIG. 13, the vertical gate segments 28A and 28B extend along the lateral edges of the island between the source/drain regions 36, 37 and 38, 39 and minimally overlap the source/drain regions 36, 37 and 38, 39 respectively. Surface gate 41 separates the source and drain regions 36, 37 and source and drain regions 38, 39. The process to form the integrated circuit of FIG. 13 would include selectively forming the trench segments which will include the gate segments 28A and 28B using the processes previously described for FIGS. 1–5 and any alternatives therefor. This will be followed by forming the remaining segments of the trenches, which are along the lateral walls which the source and drain regions 36, 37, 38, 39 intersect. This is followed by the oxidation process of FIG. 6, the filling of the moats with the oxide 30 of FIG. 7 and the planarization of FIG. 8. A device formation is then completed using the steps of FIGS. 9 and 10.

Figure 14:
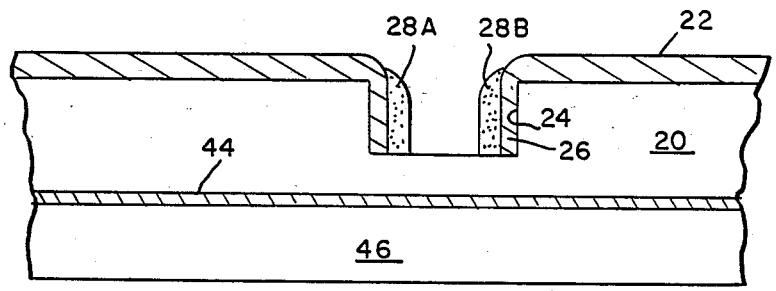
FIGS. 14 and 15 are cross-sectional views of a modified process of FIGS. 1–10 for a substrate formed in a silicon on insulator base.
Figure 15:
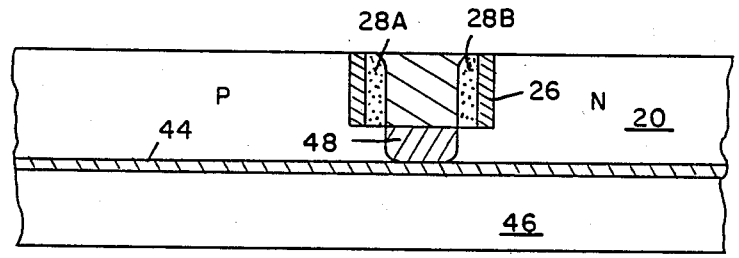

A modification of the previously described process is also applicable to a semiconductor on insulator (SOI) integrated circuits. The semiconductor layer 20 is separated from the semiconductor substrate 46 by a buried insulative layer 44. The trenching process of FIG. 1 is performed to terminate in the semiconductor layer 20 short of the buried region 44. The process steps are then performed up to and including applying the polycrystalline layer 28 of FIG. 4. The removal of the polycrystalline layer to form the gate segments 28A and 28B is conducted by reactive ion etching of FIG. 5 and produces the structure of FIG. 14. Reactive ion etching is then continued to further extend the bottom of the trench where it is not covered by the insulative layer 26 or the polycrystalline gate segments 28A and 28B. It is continued until the buried dielectric layer 44 is reached. The resulting structure is then oxidized using the process of FIG. 6, filled with oxide using the process of FIG. 7, and then planarized to produce the structure of FIG. 15, which is equivalent to FIG. 8. The extended trench portion 48 extends down to the buried insulative layer 44 and has a width determined by the separation of the polysilicon gate segments 28A and 28B.

By connecting the polycrystalline gate segments to the body, the surface contacts to the polycrystalline gate segments are eliminated. This reduces the amount of surface space needed to make these contacts.

Although the present invention has been described for CMOS insulated gate field effect transistors, it is also applicable to single devices, resistors, capacitors, junction field effect transistors of any other device formed by at least two semiconductor regions of one type separated by another semiconductor region of a second type. Although polycrystalline silicon is shown as the vertical gate material, single crystal silicon or any refractor metal or silicide or equivalent thereof can be used.

Although the present invention has been described and illustrated in detail, it is to be clearly understood that the same is by way of illustration and example only, and is not to be taken by way of limitation. The spirit and scope of the present invention are to be limited only by the terms of the appended claims.

WHAT IS CLAIMED:

1. An integrated circuit comprising:
   a first means having a first and second surface region of a first conductivity type spaced in a third region of a second conductivity type;
   a second means having a fourth and fifth surface region of said second conductivity type in a sixth region of said first conductivity type;
   a trench laterally separating said first, second and fourth, fifth regions and portions of said third and sixth regions;
   a first gate in said trench connected to said third region at the bottom of said trench and separated from said first, second and third regions laterally by a first insulative layer; and
   a second gate in said trench connected to said sixth region at the bottom of said trench, and separated from said fourth, fifth and sixth regions laterally by a second insulative layer and separated from said first gate by a third insulative layer.

2. An integrated circuit according to claim 1, wherein said first and second means are insulated gate field effect transistors and said third and sixth regions are body regions of said transistors.

3. An integrated circuit according to claim 2, wherein said first and second gates are polycrystalline semiconductor material of second and first conductivity types, respectively.

4. An integrated circuit according to claim 2, wherein:
   said third and sixth regions are encompassed laterally by trenches filled with dielectric material;
   said first gate extends only along a lateral edge of a trench at which said third region laterally isolates said first and second regions; and
   said second gate extends only along a lateral edge of a trench at which said sixth region laterally isolates said fourth and fifth regions.

5. An integrated circuit according to claim 2, including a buried dielectric layer under said third and sixth regions, and said trench between said first and second gates extends to said buried dielectric layer and is filled with dielectric insulation to laterally isolate said third and sixth regions.

6. An integrated circuit according to claim 1, wherein said first and second gates are polycrystalline semiconductor material of second and first conductivity types, respectively.

7. An integrated circuit according to claim 1, wherein:
   said third and sixth regions are encompassed laterally by trenches filled with dielectric material;
   said first gate extends only along a lateral edge of a trench at which said third region laterally isolates said first and second regions; and
   said second gate extends only along a lateral edge of a trench at which said sixth region laterally isolates said fourth and fifth regions.

8. An integrated circuit according to claim 1, wherein said first and second gates are a material from the group of polycrystalline silicon, single crystal silicon, refractory metals and silicides.

9. An integrated circuit according to claim 1, wherein:
   said first gate extends vertically at least the depth of said first and second regions and extends laterally at least the width of the portion of said third region which separates said first and second regions; and
   said second gate extends vertically at least the depth of said fourth and fifth regions and extends laterally at least the width of the portion of said sixth region which separates said fourth and fifth regions.

10. An integrated circuit comprising:
    a first means having a first and second surface region of a first conductivity type spaced in a third region of a second conductivity type;
    a second means having a fourth and fifth surface region of said second conductivity type in said sixth region of said first conductivity type;
    a trench laterally separating said first, second and fourth, fifth regions and portions of said third and sixth regions;
    a first gate in said trench connected to said third region, and separated from said first and second regions and portions of said third region laterally by a first insulative layer, and said first gate extends vertically at least the depth of said first and second regions and extends laterally at least the width of the portion of said third region which separates said first and second regions;
    a second gate in said trench connected to said sixth region, separated from said fourth and fifth regions and portions of said sixth region laterally by a second insulative layer, and separated from said first gate by a third insulative layer; and
    said second gate extends vertically at least the depth of said fourth and fifth regions and extends laterally at least the width of the portion of said sixth region which separates said fourth and fifth regions.

11. An integrated region comprising:
    a first means having a first and second surface region of a first conductivity type spaced in a third region of a second conductivity type;
    a second means having a fourth and fifth surface region of said second conductivity type in a sixth region of said first conductivity type;
    a buried dielectric layer under said third and sixth regions;
    a trench laterally separating said first, second and fourth, fifth regions;
    a first gate in said trench connected to said third region at the bottom of said trench and separated from said first, second and third regions laterally by a first insulative layer;
    a second gate in said trench connected to said sixth region at the bottom of said trench, and separated from said fourth, fifth and sixth regions laterally by a second insulative layer and separated from said firsts gate by a third insulative layer; and
said trench extending to said buried dielectric layer between said first and second gates and being filled with dielectric insulation to laterally isolate said third and sixth regions.

* * * * *